(12) United States Patent
Fuyutsume et al.

(10) Patent No.: US 8,319,394 B2
(45) Date of Patent: Nov. 27, 2012

(54) ACOUSTIC WAVE DEVICE AND METHOD FOR MANUFACTURING THE SAME

(75) Inventors: Toshiyuki Fuyutsume, Kyoto (JP); Taro Nishino, Kyoto (JP); Hisashi Yamazaki, Kyoto (JP); Kiyoto Araki, Kyoto (JP); Noboru Tamura, Yamanashi (JP); Nakaba Ichikawa, Yamanashi (JP); Masaki Aruga, Yamanashi (JP)

(73) Assignees: Murata Manufacturing Co., Ltd., Kyoto (JP); Koike Co., Ltd., Yamanshi (JP)

( * ) Notice: Subject to any disclaimer, the term of this patent is extended or adjusted under 35 U.S.C. 154(b) by 305 days.

(21) Appl. No.: 12/864,073

(22) PCT Filed: Nov. 26, 2008

(86) PCT No.: PCT/JP2008/071416
§ 371 (c)(1),
(2), (4) Date: Jul. 22, 2010

(87) PCT Pub. No.: WO2009/093377
PCT Pub. Date: Jul. 30, 2009

(65) Prior Publication Data
US 2010/0301700 A1    Dec. 2, 2010

(30) Foreign Application Priority Data

Jan. 25, 2008   (JP) ................................. 2008-015441

(51) Int. Cl.
*H03H 9/25*   (2006.01)

(52) U.S. Cl. .................... 310/313 R; 310/340; 310/346; 29/25.35

(58) Field of Classification Search ............. 310/313 R, 310/340, 346; 29/25.35
See application file for complete search history.

(56) References Cited

U.S. PATENT DOCUMENTS

| 5,224,972 A | * | 7/1993 | Frye et al. | ........................... 95/9 |
| 6,245,439 B1 | * | 6/2001 | Yamada et al. | ............... 428/546 |
| 2004/0191497 A1 | * | 9/2004 | Hiraoka et al. | ............ 428/304.4 |
| 2008/0024037 A1 | | 1/2008 | Tamura et al. | |

FOREIGN PATENT DOCUMENTS

| JP | 06-326553 A | 11/1994 |
| JP | 2002-016468 A | 1/2002 |
| JP | 2005-229455 A | 8/2005 |
| JP | 2008-054276 A | 3/2008 |

* cited by examiner

*Primary Examiner* — Thomas M Dougherty
(74) *Attorney, Agent, or Firm* — Harness, Dickey & Pierce, PLC

(57) ABSTRACT

Provided are an acoustic wave device and a method for manufacturing the same, the acoustic wave device being effectively prevented from expanding and contracting due to temperature change and having a small frequency shift. The acoustic wave device of the present invention has a piezoelectric substrate (1) having an IDT (2) formed on one principal surface of the piezoelectric substrate (1), and a thermal spray film (3) formed on an opposite principal surface (1*b*) of the piezoelectric substrate (1), the thermal spray film being of a material having a smaller linear thermal expansion coefficient than the piezoelectric substrate (1) and having grain boundaries and pores (4), at least a part of which is filled with a filling material (5).

11 Claims, 2 Drawing Sheets

[FIG. 1]
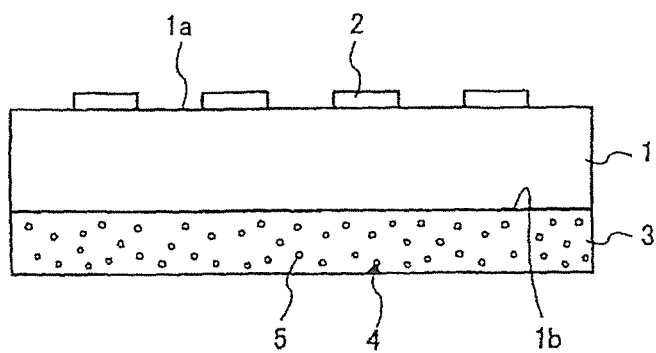
[FIG. 2]
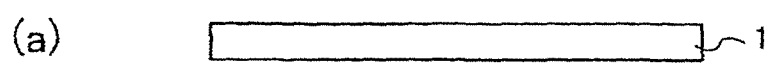
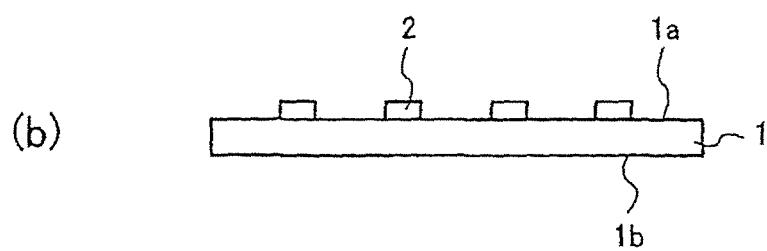
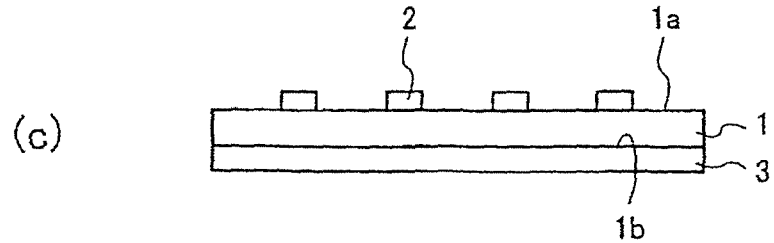

[FIG. 3]
(a) 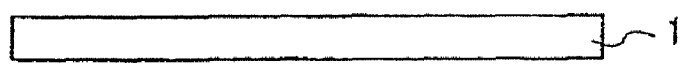
(b) 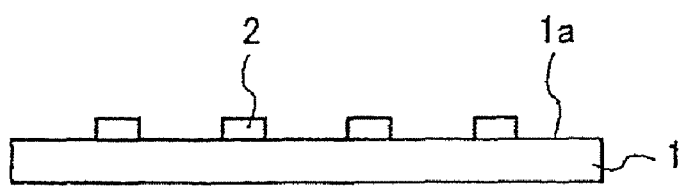
(c) 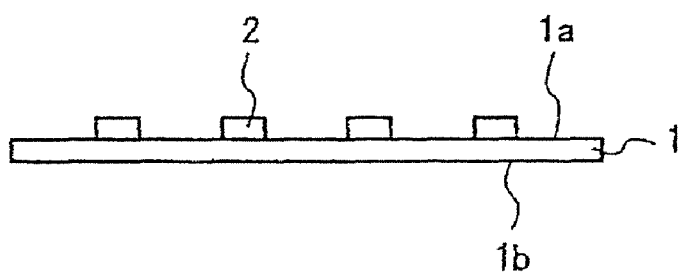
(d) 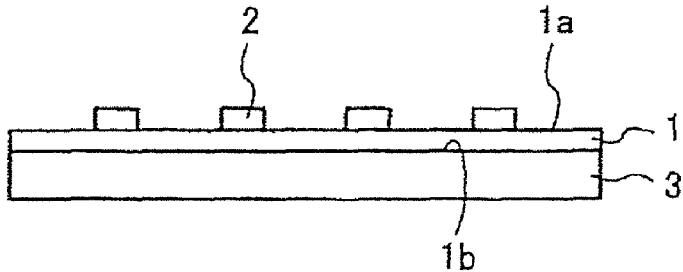

ACOUSTIC WAVE DEVICE AND METHOD FOR MANUFACTURING THE SAME

TECHNICAL FIELD

The present invention relates to an acoustic wave device such as a surface acoustic wave (SAW) device and a boundary acoustic wave device and a method for manufacturing the same.

BACKGROUND ART

The acoustic wave device is, as disclosed in the patent document 1, a device having an inter-digital transducer (IDT) formed on a piezoelectric substrate such as lithium tantalate ($LiTaO_3$: LT) substrate or lithium niobate ($LiNbO_3$: LN) substrate. The LT and LN have thermal expansion coefficients that are six times higher than the thermal expansion coefficient of silicon (the thermal expansion coefficients of LT and LN are about $16 \times 10^{-6}$/K and $15 \times 10^{-6}$/K, respectively, while the thermal expansion coefficient of silicon is about $2.6 \times 10^{-6}$/K). Then, if the LT or LN substrate is used in the acoustic wave device, there arises a significant problem of change in filtering characteristics due to temperature change. Therefore, temperature compensation is performed in various methods (see the patent documents 1 and 2).

[Patent document 1] Japanese Patent Application Laid-Open No. 2001-44790
[Patent document 2] Japanese Patent Application Laid-Open No. 10-4332

DISCLOSURE OF THE INVENTION

Recently, cell phones that have an acoustic wave device mounted thereon require minimizing of the frequency shift, and therefore, piezoelectric substrates are required to be prevented from being modified in properties due to temperature change as much as possible. However, for the LT substrate or LN substrate used alone, it is difficult to meet the requirement to reduce the frequency shift due to temperature change.

The present invention was carried out in view of the foregoing and has an object to provide an acoustic wave device and a method for manufacturing the same, the acoustic wave device being effectively prevented from expanding and contracting due to temperature change and having a small frequency shift.

The acoustic wave device of the present invention has a piezoelectric substrate having an inter-digital transducer formed on one principal surface of the piezoelectric substrate; and a thermal spray film formed on an opposite principal surface of the piezoelectric substrate, the thermal spray film being of a material having a smaller linear thermal expansion coefficient than the piezoelectric substrate and the thermal spray film having grain boundaries and pores, at least a part of which is filled with a filling material.

According to this structure, as at least a part of the grain boundaries and pores of the thermal spray film is filled with the filling material, the rigidity of the thermal spray film is enhanced. This makes it possible to obtain the acoustic wave device that is effectively prevented from expanding and contracting due to temperature change of the piezoelectric substrate and having a small frequency shift.

In the acoustic wave device of the present invention, it is preferable that a filling factor of the filling material per unit area in a cross section of the thermal spray film is 60% or more.

In the acoustic wave device of the present invention, it is preferable that at least one selected from the group consisting of mullite, alumina, silicon and yttria may be used as the material of the thermal spray film.

In the acoustic wave device of the present invention, it is preferable that the piezoelectric substrate is a lithium tantalate substrate or a lithium niobate substrate.

In the acoustic wave device of the present invention, it is preferable that the filling material is selected from the group consisting of silicon, alumina, silicon nitride and silicon dioxide.

The method for manufacturing an acoustic wave device of the present invention comprising the steps of: forming an inter-digital transducer on one principal surface of a piezoelectric substrate; forming a film on an opposite principal surface of the piezoelectric substrate on which the inter-digital transducer is formed, by thermal spraying a material having a smaller linear thermal expansion coefficient than the piezoelectric substrate; and filling grain boundaries and pores in the film formed by thermal spraying with a filling material.

In the method for manufacturing the acoustic wave device of the present invention, it is preferable that the step of forming the film by thermal spraying and the step of filling the grain boundaries and pores with the filling material are performed repeatedly.

In the method for manufacturing the acoustic wave device of the present invention, it is preferable that the step of filling the grain boundaries and pores with the filling material comprises applying the filling material onto the film at least once and curing the filling material.

The acoustic wave device of the present invention has a piezoelectric substrate having an IDT formed on one principal surface of the piezoelectric substrate and a thermal spray film formed on an opposite principal surface of the piezoelectric substrate, the thermal spray film being of a material having a smaller linear thermal expansion coefficient than the piezoelectric substrate, and at least a part of grain boundaries and pores of the thermal spray film is filled with a filling material. With this structure, the obtained acoustic wave device can be effectively prevented from expanding and contracting due to temperature change and have a small frequency shift.

BRIEF DESCRIPTION OF THE DRAWINGS

FIG. 1 is a view illustrating an acoustic wave device according to an embodiment of the present invention;

FIGS. 2(a) to 2(c) are views each explaining a method for manufacturing an acoustic wave device according to an embodiment of the present invention; and FIGS. 3(a) to 3(d) are views each explaining another example of the method for manufacturing an acoustic wave device according to the embodiment of the present invention.

BEST MODE FOR CARRYING OUT THE INVENTION

With reference to the attached drawings, embodiments of the present invention will be described in detail below.

FIG. 1 illustrates an acoustic wave device according to an embodiment of the present invention. Here, the acoustic wave device includes a surface acoustic wave (SAW) device and a buried propagating-layer acoustic wave device. The acoustic wave device illustrated in FIG. 1 principally has a piezoelectric substrate 1 having an IDT (Inter-Digital Transducer) 2 formed on one principal surface 1a of the piezoelectric substrate 1 and a thermal spray film 3 formed on the other principal surface 1b of the piezoelectric substrate 1, the thermal spray film 3 being of a material that has a smaller linear thermal expansion coefficient than the piezoelectric substrate 1. The thermal spray film 3 has a large number of pores 4. In FIG. 1, the pores 4 are only illustrated in the thermal spray film 3, however many grain boundaries also exist therein. Then, at least a part of the pores 4 and grain boundaries of the thermal spray film 3 is filled with a filling material 5.

The piezoelectric substrate 1 includes a lithium tantalate substrate (LT substrate), a lithium niobate substrate (LN substrate) and the like.

Alumina, mullite, silicon, yttria and the like may be used as the material having a smaller linear thermal expansion coefficient than the piezoelectric substrate 1 used in thermal spraying (material of the thermal spray film). Splay deposition is a way for forming a film by using electric energy (arc, plasma) or combustion energy as a heat source and charging coating material powder or bar material therein to thermal spray it on the surface of the substrate as fine particles in a molten or semi-molten state. By adoption of this thermal spray deposition, it becomes possible to effectively prevent the thermal influence on the piezoelectric substrate during deposition. This enables prevention of cracking and peel-off due to an increase in temperature in substrate forming.

The thermal spray film 3 is usually porous and its rigidity is relatively small. Therefore, the grain boundaries and pores 4 of the thermal spray film 3 are filled with a filling material 5. As the filling material 5, silicon, alumina, silicon nitride, silicon dioxide or the like may be used. Further it is preferable that the filling factor of the filling material 5 per unit area in a cross section of the thermal spray film 3 is 60% or more. As the grain boundaries and pores 4 of the thermal spray film 3 are thus filled with the filling material 5, the rigidity of the thermal spray film 3 is enhanced. With this enhanced rigidity, the piezoelectric substrate 1 can be effectively prevented from expanding and contracting due to temperature change and it becomes possible to obtain an acoustic wave device with a small frequency shift. Here, the filling factor of the filling material 5 is calculated by using a wavelength dispersive X-ray spectroscopy (WDX), as a ratio of the number of pores 4 per unit area in a cross section of the thermal spray film 3 after the filling material 5 is filled to the number of pores 4 per unit area in the cross section of the thermal spray film 3 before the filling material 5 is filled (the number of pores per unit area of the thermal spray film after filling/the number of pores per unit area of the thermal spray film before filling).

Filling the pores 4 and grain boundaries of the thermal spray film 3 with the filling material 5 is performed by CVD (Chemical Vapor Deposition), PDV (Physical Vapor Deposition) and SOG (Spin On Glass).

Further, the thermal spray film 3 may have a plurality of layers. When the thermal spray film 3 is a multi-layer film, various materials may be combined thereby to be able to adjust the linear thermal expansion coefficient of the thermal spray film 3 easily.

In the method for manufacturing the acoustic wave device of the present invention, the IDT 2 is formed on one principal surface 1a of the piezoelectric substrate 1, and a film (thermal spray film) is formed on the opposite principal surface 1b of the IDT-formed piezoelectric substrate 1 by thermal spraying a material having a smaller linear thermal expansion coefficient than the piezoelectric substrate 1. This thermal spray film 3 has pores 4 and grain boundaries, which are filled with a filling material 5.

For example, the piezoelectric substrate 1 is prepared as illustrated in FIG. 2(a), and then, an IDT 2 is formed on one principal surface 1a of the substrate 1 as illustrated in FIG. 2(b). When the IDT 2 is formed, an IDT electrode material is deposited on the principal surface 1a of the piezoelectric substrate 1 and a resist layer (not shown) is formed on the IDT electrode material layer (not shown). Then, the resist layer is exposed via a photomask at a region where the IDT is to be formed, and developed to be patterned. The patterned resist layer is used as a mask to etch the IDT electrode material layer. Then, a remaining part of the resist layer is removed. Here, there is no particular restriction on the shape of the IDT 2 and its forming method.

Next, as illustrated in FIG. 2(c), a thermal spray film 3 is formed on the opposite principal surface (back surface) 1b of the piezoelectric substrate 1 by thermal spray deposition. The thermal spray film 3 is made of a material having a smaller linear thermal expansion coefficient than the piezoelectric substrate 1. Then, grain boundaries and pores 4 of the thermal spray film 3 are filled with a filling material 5.

As the grain boundaries and pores 4 of the thermal spray film 3 are small, it is sometimes difficult to charge the filling material 5 in the grain boundaries and pores 4 in a deep area of the thermal spray film 3 sufficiently. Therefore, it is preferable that the step of forming a film by thermal spraying and the step of filling the grain boundaries and pores 4 with a filling material 5 are performed repeatedly. By this repetition, the area where the grain boundaries and pores 4 are sufficiently filled with the filling material 5 can be increased in the thickness direction of the thermal spray film 3.

Further, if the step of filling the grain boundaries and pores 4 with a filling material 5 is performed by coating the thermal spray film 3 with the filling material 5 and curing the filling material 5, the filling material 5 is applied at least once to be cured. Here, the number of coatings may be adjusted in accordance with the concentration and viscosity of the filling material 5. For example, if the concentration of the filling material 5 is low, the number of coatings is increased. Thereby, the grain boundaries and pores 4 can be filled with the filling material 5 efficiently.

Furthermore, the method for manufacturing an acoustic wave device may be performed as follows. The piezoelectric substrate 1 is prepared as illustrated in FIG. 3(a), and an IDT 2 is formed on one principal surface 1a as illustrated in FIG. 3(b). Then, as illustrated in FIG. 3(c), the piezoelectric substrate 1 is made thinner by reducing the thickness of the back surface 1b side, and as illustrated in FIG. 3(d), a thermal spray film 3 is formed on the back surface 1b of the piezoelectric substrate 1 by thermal spray deposition. Thickness reduction of the piezoelectric substrate 1 is performed, for example, by blasting, lapping, grinding or the like.

Next description is made about examples made to clarify the effect of the present invention.

Example 1

A substrate of lithium tantalate (LT substrate) was prepared having a linear thermal expansion coefficient of $16 \times 10^{-6}$/K and a thickness of 0.02 mm, and alumina was deposited on a back surface (surface to be thermal sprayed) of the substrate by thermal spray deposition thereby to form a 4-inch substrate having a total thickness of 0.35 mm. Thermal spraying was performed with use of a DC plasma thermal spray device using Ar plasma gas and at power supply output of 40 kW. Then, perhydro-polysilazane was applied as a filling material onto this thermal spray film and cured so that the grain boundaries and pores of the thermal spray film were filled with high-purity silica glass. Of this thermal spray film, the filling factor was calculated with use of a WDX to be 60%.

The thus-obtained 4-inch substrate was investigated as to the temperature compensation effect. The temperature compensation effect of the acoustic wave device can be determined by investigating the temperature coefficient of frequency (TCF). A substrate for comparison used here was an LT substrate having a linear thermal expansion coefficient of $16 \times 10^{-6}$/K, a diameter of 4 inches and a thickness of 0.35 mm. With the above-described 4-inch substrate, the TCF was advantageously enhanced about 35% as compared with the LT substrate alone.

Example 2

A substrate of lithium tantalate (LT substrate) was prepared having a linear thermal expansion coefficient of $16 \times 10^{-6}$/K and a thickness of 0.02 mm, and alumina was deposited on a back surface (surface to be thermal sprayed) of the substrate by thermal spray deposition thereby to form a 4-inch substrate having a total thickness of 0.35 mm. Thermal spraying was performed with use of a DC plasma thermal spray device using Ar plasma gas and at power supply output of 40 kW. Then, perhydro-polysilazane was applied as a filling material onto this thermal spray film and cured so that the grain boundaries and pores of the thermal spray film were filled with high-purity silica glass. The above-described thermal spray deposition step and the grain boundary and pore filling step were performed totally three times. The thus-obtained 4-inch substrate was investigated as to the temperature compensation effect, which was found to be advantageously improved about 43% as compared with the LT substrate alone. This was thought to be because the area where the grain boundaries and pores of the thermal spray film were sufficiently filled with the filling material could be increased in the thickness direction of the thermal spray film.

Reference Example

On a back surface (surface to be thermal sprayed) of a substrate of lithium tantalate (LT substrate) having a linear thermal expansion coefficient of $16 \times 10^{-6}$/K and a thickness of 0.02 mm, alumina was deposited by thermal spray deposition thereby to form a 4-inch substrate having a total thickness of 0.35 mm. Thermal spraying was performed with use of a DC plasma thermal spray device using Ar plasma gas and at power supply output of 40 kW. The thus-obtained 4-inch substrate was investigated as to the temperature compensation effect, which was found to be advantageously improved about 28% as compared with the LT substrate alone.

The present invention is not limited to the above-described embodiment and may be embodied in various modified forms. The shapes, dimensions, materials in the above-described embodiments and so on are merely given by way of example and may be modified appropriately as far as the effect of the present invention is not adversely affected. Further, the present invention may be embodied in various modified forms without departing from the scope of the present invention.

The invention claimed is:

1. An acoustic wave device comprising:
    a piezoelectric substrate having an inter-digital transducer formed on one principal surface of the piezoelectric substrate; and
    a spray film formed on an opposite principal surface of the piezoelectric substrate, the spray film being of a material having a smaller linear thermal expansion coefficient than the piezoelectric substrate and the spray film having grain boundaries and pores, at least a part of which is filled with a filling material.

2. The acoustic wave device of claim 1, wherein a filling factor of the filling material per unit area in a cross section of the spray film is 60% or more.

3. The acoustic wave device of claim 1 or 2, wherein at least one selected from the group consisting of mullite, alumina, silicon and yttria may be used as the material of the spray film.

4. The acoustic wave device of any one of claims 1 to 2, wherein the piezoelectric substrate is a lithium tantalate substrate or a lithium niobate substrate.

5. The acoustic wave device of any one of claims 1 to 2, wherein the filling material is selected from the group consisting of silicon, alumina, silicon nitride and silicon dioxide.

6. A method for manufacturing an acoustic wave device, comprising the steps of:
    forming an inter-digital transducer on one principal surface of a piezoelectric substrate;
    forming a film on an opposite principal surface of the piezoelectric substrate on which the inter-digital transducer is formed, by spraying a material having a smaller linear thermal expansion coefficient than the piezoelectric substrate; and
    filling grain boundaries and pores in the film formed by spraying with a filling material.

7. The method of claim 6, wherein the step of forming the film by spraying and the step of filling the grain boundaries and pores with the filling material are performed repeatedly.

8. The method of claim 6 or 7, wherein the step of filling the grain boundaries and pores with the filling material comprises applying the filling material onto the film at least once and curing the filling material.

9. The acoustic wave device of claim 3, wherein the piezoelectric substrate is a lithium tantalate substrate or a lithium niobate substrate.

10. The acoustic wave device of claim 3, wherein the filling material is selected from the group consisting of silicon, alumina, silicon nitride and silicon dioxide.

11. The acoustic wave device of claim 4, wherein the filling material is selected from the group consisting of silicon, alumina, silicon nitride and silicon dioxide.

* * * * *